United States Patent
Wheeler

(10) Patent No.: US 6,673,525 B1
(45) Date of Patent: Jan. 6, 2004

(54) THIN LAYER IMAGING PROCESS FOR MICROLITHOGRAPHY USING RADIATION AT STRONGLY ATTENUATED WAVELENGTHS

(75) Inventor: David R. Wheeler, Albuquerque, NM (US)

(73) Assignee: EUV LLC, Santa Clara, CA (US)

( * ) Notice: Subject to any disclaimer, the term of this patent is extended or adjusted under 35 U.S.C. 154(b) by 0 days.

(21) Appl. No.: 09/510,726

(22) Filed: Feb. 22, 2000

Related U.S. Application Data

(63) Continuation-in-part of application No. 09/056,439, filed on Apr. 7, 1998, now abandoned.

(51) Int. Cl.[7] ................................................. G03F 7/00
(52) U.S. Cl. ........................ 430/326; 430/313; 430/314; 430/315; 430/322; 430/323; 430/325
(58) Field of Search .................................. 430/326, 313, 430/323, 315, 324, 325

(56) References Cited

U.S. PATENT DOCUMENTS

| | | | | |
|---|---|---|---|---|
| 4,187,331 A | * | 2/1980 | Hsioh-Lien Ma | 430/328 |
| 4,426,247 A | * | 1/1984 | Tamamura et al. | 156/643 |
| 4,791,171 A | * | 12/1988 | Cunningham | 525/100 |
| 4,921,778 A | * | 5/1990 | Thackeray et al. | 430/326 |
| 5,079,131 A | * | 1/1992 | Thackeray et al. | 430/326 |
| 5,108,875 A | * | 4/1992 | Thackeray et al. | 430/326 |
| 5,128,232 A | * | 7/1992 | Thackeray et al. | 430/192 |
| 5,366,852 A | * | 11/1994 | Pavelchek et al. | 430/326 |
| 5,487,967 A | * | 1/1996 | Hutton et al. | 430/322 |
| 5,550,007 A | * | 8/1996 | Taylor et al. | 430/314 |
| 5,756,256 A | * | 5/1998 | Nakato et al. | 430/272.1 |

* cited by examiner

*Primary Examiner*—Janet Baxter
*Assistant Examiner*—Yvette C. Thornton
(74) *Attorney, Agent, or Firm*—Donald A. Nissen

(57) ABSTRACT

A method for patterning of resist surfaces which is particularly advantageous for systems having low photon flux and highly energetic, strongly attenuated radiation. A thin imaging layer is created with uniform silicon distribution in a bilayer format. An image is formed by exposing selected regions of the silylated imaging layer to radiation. The radiation incident upon the silyliated resist material results in acid generation which either catalyzes cleavage of Si—O bonds to produce moieties that are volatile enough to be driven off in a post exposure bake step or produces a resist material where the exposed portions of the imaging layer are soluble in a basic solution, thereby desilylating the exposed areas of the imaging layer. The process is self limiting due to the limited quantity of silyl groups within each region of the pattern. Following the post exposure bake step, an etching step, generally an oxygen plasma etch, removes the resist material from the de-silylated areas of the imaging layer.

14 Claims, 1 Drawing Sheet

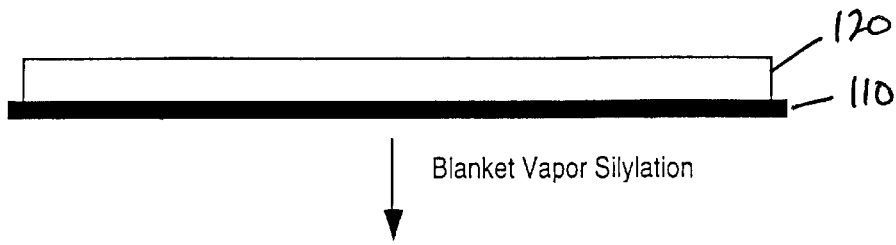
Fig. 1
Blanket Vapor Silylation
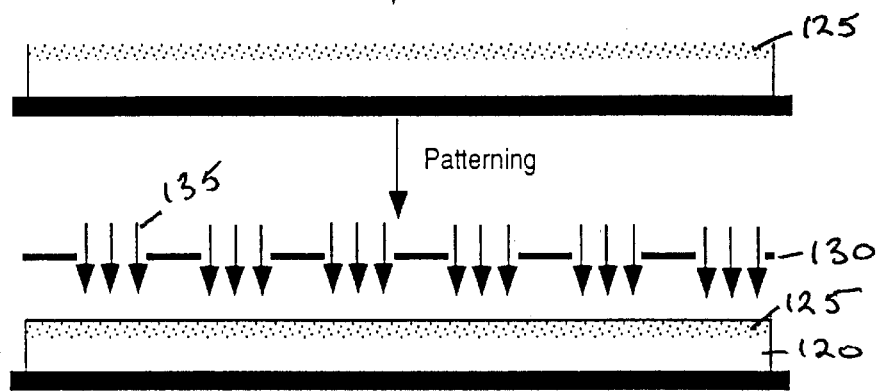
Fig. 2
Patterning
Fig. 3
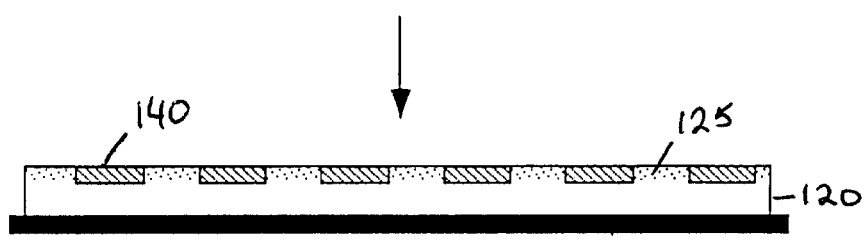
Fig. 4
Post Exposure Bake
Fig. 5
O₂ Plasma etch
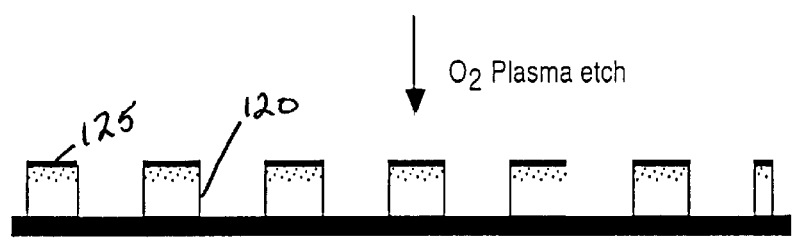
Fig. 6

THIN LAYER IMAGING PROCESS FOR MICROLITHOGRAPHY USING RADIATION AT STRONGLY ATTENUATED WAVELENGTHS

CROSS-REFERENCE TO RELATED APPLICATIONS

This Application is a Continuation-in-Part of prior U.S. patent application Ser. No. 09/056,439 filed on Apr. 7, 1998 now abandoned having the same title, now abandoned.

STATEMENT OF GOVERNMENT INTEREST

This invention was made with Government support under contract no. DE-AC04-94AL85000 awarded by the U.S. Department of Energy to Sandia Corporation. The Government has certain rights in the invention.

BACKGROUND OF THE INVENTION

This invention pertains generally to a method for manufacturing integrated circuits that satisfy narrow design rules and more particularly to an improved thin layer imaging process for photoresist patterning in systems having low radiation flux and highly energetic, strongly attenuated radiation.

As integrated circuits have become smaller the demands to achieve submicron resolution with satisfactory line width control have become increasingly important. Design rules of 0.5 $\mu$m are being replaced by design rules that require feature sizes of 0.25 to 0.18 $\mu$m and significant effort is presently being put into achieving 0.1 $\mu$m resolution.

Integrated circuits are manufactured using lithographic processes. Energy (generally electromagnetic radiation, i.e., light) is caused to interact selectively with an energy sensitive resist material deposited onto a substrate in such a way that a pattern or image is produced on the resist material. The resist material is developed and the pattern is transferred by etching onto the substrate.

The energy used to expose the resist material, the composition of the resist material, the thickness of the resist material, and many other factors affect the ability of a lithographic process to delineate a feature on a substrate. The smaller the design rule (feature size) the more precisely the feature must be delineated. This requirement, coupled with the demand for smaller feature sizes has driven the wavelength of radiation needed to produce the desired pattern to ever shorter wavelengths. Shorter wavelength light is strongly absorbed by the resist material and thus unable to penetrate much below the surface of the resist material. By way of example, the characteristic attenuation length for 13.4 nm radiation (the wavelength desired for 0.1 $\mu$m feature size) is on the order of 0.1–0.2 $\mu$m for most organic films. If a standard 0.5–0.8 $\mu$m thick resist material is required for further processing it will result in a wall profile significantly less than 80 degrees and hence unacceptable critical dimension control.

The topography of the substrate surface may also adversely affect the ability of the lithographic process to define features on the substrate. When a single layer of resist material is applied over a nonplanar substrate pattern, light scattering by the resist material and substrate, as well as the potential inability of the light to completely penetrate and uniformly expose the resist material can result in errors in the defined lithographic pattern. Consequently, surface imaging lithographic processes have been developed that do not require that the resist material be exposed throughout its entire thickness. These processes are referred to as surface imaging processes because they define features only in the near surface region of the resist.

While surface imaging is absolutely required for patterning advanced integrated circuits using highly attenuated radiation, the technology may also offer advantages in any case of narrow design rules where standard lithographic processes are difficult due to severe wafer topography or radiation reflection or depth of focus (DOF) limitations since imaging just the surface of the resist relaxes DOF requirements. High numerical aperture steppers, while capable of printing smaller features at a given wavelength, often have small DOF and this can preclude focused exposure through the thickness of the film. By providing a planarizing layer disposed between the surface of the substrate and the imaging layer, it is possible to deposit a uniform imaging layer having minimum thickness, thereby reducing problems associated with variations in DOF.

Four basic surface imaging technologies are well known in the art; single layer silylation processes, bilayer processes, trilayer processes, and a variation of the standard bilayer process in which the topmost resist layer is reactive to a silylation reagent.

In the standard bilayer process a relatively thick layer of resist material (typically 1.5–4 times the height of the highest step on the substrate) is deposited on the surface of a substrate as a planarizing processing layer. A second imaging resist layer is spin cast onto the surface of the planarizing layer. A circuit pattern is produced on the surface of the resist material which is subsequently developed, exposing portions of the underlying planarizing layer. The mask pattern is transferred from the imaging layer directly onto the surface of the substrate by etching through the planarizing layer by standard device processing. Bilayer systems have not found ready acceptance for high volume applications due to their processing complexity and expense.

Trilayer resist processes incorporate a highly etch resistant layer i.e., "hard" layer, between the two resist layers of the bilayer process. Typically, this intervening hard layer is composed of a sputtered metal or a refractory material such as silicon dioxide, which can either be applied through a conventional chemical vapor deposition processes or by a liquid deposition process wherein silicon dioxide particles or silicon containing polymer, oligomers or clusters are suspended or dissolved in a liquid that desirably evaporates quickly to leave a glass-like layer referred to as spin-on-glass (SOG). While the trilayer process has eliminated many of the problems encountered with the bilayer process, other complications are associated with this process. For example, the susceptibility of the silicon dioxide hard mask layer to internal and surface defects caused by agglomeration of silicon dioxide particles or cracking of the hard mask layer due to internal stresses limit the usefulness of this process. The defect density associated with the application of a very thin imaging layer over an often rough middle layer is also a major issue for the trilayer process.

Another approach to imaging a circuit pattern onto a substrate involves introducing silicon into the surface layer of a resist material after exposure as described by Coopmans, et al. "DESIRE: A New Route to Submicron Optical Lithography", *Solid State Technology*, pp. 93–97, June 1987. In this process a resist material is coated onto a substrate or an intervening planarizing layer and a circuit pattern is produced on the resist material by a standard UV exposure. The exposed wafer is subjected to silylation by either a gaseous or liquid silicon containing compound such as hexamethyldisilizane (HMDS) or silicon tetrachloride, whereby silicon is incorporated into the polymer. Depending upon the changes in the resist material caused by exposure to UV the silylating reagent can be incorporated either into the exposed or unexposed regions of the resist material. Silicon which has been incorporated into the resist material will be converted to an etch protective oxide when exposed to the oxygen etch process of the pattern transfer step. Consequently, the silylated regions of the polymer will etch at a significantly slower rate than the unsilylated regions.

Exposure to UV light can cause reactive groups to form in the resist material which react selectively with a silylating reagent such as disclosed in U.S. Pat. No. 4,751,170. Depending upon the composition of the resist material, exposure to UV light can cause the resist material to crosslink and/or form groups that react selectively with silylating agents as disclosed in U.S. Pat. Nos. 5,487,967 and 5,550,007. Diffusion of the silylating reagent is inhibited by the crosslinked regions of the resist material. Thus, those areas of the resist material that are crosslinked will be more easily etched. A modification of this process is disclosed in U.S. Pat. No. 4,931,351, wherein the resist material is first conventionally exposed to radiation, then developed by contacting the exposed resist material with a suitable developer known to those skilled in the art, such as tetramethylammonium hydroxide (TMAH) and the like, and then exposed to UV light to enhance reaction of the resist material with a silylating reagent to produce an etch resistant silylated resist material.

In another embodiment, a polysiloxane material is employed as a resist material, J. Shaw et al., "Polysiloxanes for Optical Lithography", *Solid State Technology*, pp. 83–89, June 1987. Here exposure to deep UV (light having a wavelength less than about 270 nm) causes the polysiloxane material to crosslink reducing its solubility. The unexposed material is removed by rinsing with an organic solvent.

U.S. Pat. Nos. 5,286,607, 5,486,424, and 5,545,512 disclose a further modification of the original silylation process. Here a first resist layer is applied to a substrate and exposed to radiant energy, generally UV radiation, to create an acid reaction product. The irradiated first resist layer is then softbaked and subsequently exposed to a silylating reagent, such as HMDS, for a period of time sufficient for the reagent to penetrate into the resist layer, typically ≈2000–3000 Å. During the softbake step the resist layer can crosslink. The substrate can now be processed by standard methods, i.e., applying a second resist layer and forming a circuit pattern by conventional photolithographic and etching steps. After the circuit pattern has been formed on the second resist layer the substrate is subjected to a plasma etching step. The plasma etching step is composed of two parts. In the first part, exposed portions of the silicon enriched layer are removed using conventional silicon dioxide etching processes, such as the use of hydroflurocarbon gases. In the second part, the remaining portions of the second resist layer are removed by an oxidizing etch and the remaining portions of the first silylated resist layer are converted to silicon dioxide. The resulting silicon dioxide layer acts as a mask for etching the substrate.

While the use of silicon-based chemistry in top surface imaging (TSI) processes affords certain advantage in wafer processing, there are numerous disadvantages associated with the various aforementioned processes. The characteristics of the silylated layer largely determine the ultimate lithographic performance of the TSI process. Low silicon content contributes to low etch resistance and difficult CD control during etch. Large pattern distortion caused by swelling associated with incorporation of the silicon-containing reagent can also lead to loss of resolution and poor lithographic performance. On the other hand, incorporation of significant amounts of silylating reagent can lead to reduction of the glass transition temperature ($T_g$) of the polymer resist material leading to undesirable flow of the silylated resist and silylation in unwanted areas. Finally, in a TSI scheme resolution is limited by the size dependence of the silylation process wherein larger features are silylated more heavily than smaller ones which leads to insufficient silylation and thus loss of the silylated etch mask for features smaller than 0.1 µm. Attempts to rectify this problem by increasing the silylation of smaller features also increases the silylation of the larger features leading to pattern distortion.

While the process of exposing a resist layer to radiant energy followed by the step of exposing the entire resist layer to a silylation treatment affords some advantage over the more traditional silylation methods it too suffers from a significant limitation; a second resist layer must be spun onto the silylated resist layer. The use of a second resist layer to pattern the silylated resist layer can be undesirable in the case of deep or extreme ultraviolet lithography. Because radiation with a wavelength below ≈248 nm is strongly attenuated in organic resist material the resist layer must be relatively thin (typically less than 1000 Å) in order to avoid sloping sidewalls. However, resist layers thinner than 1500–2000 Å are prone to pin hole and density defects arising from nonuniform coating of the substrate material. Moreover, the processes themselves are complex with a large number of processing steps.

From the foregoing it can be seen that with the trend toward narrower design rules there is a growing need for a lithographic method capable of producing high resolution submicron patterned resist images having excellent etch resistance and thermal and dimensional stability, that is compatible with existing resist materials and processing facilities, and affords convenient device processing.

SUMMARY OF THE INVENTION

The invention disclosed herein provides a novel method for resist patterning which is particularly advantageous for lithographic systems having low radiation flux and highly energetic, strongly attenuated radiation.

In contrast to prior art processes generally, wherein an in-situ etch mask is formed by introducing silicon into the resist material following exposure or pattern development, in the manner described above, the process disclosed herein first creates a thin imaging layer with uniform silicon distribution in a bilayer format. Pattern development then incorporates a de-silylation step, following exposure, that is self limiting due to the limited quantity of silyl groups within each region of the pattern. Further, the need for a second patterning resist layer is eliminated.

An imaging layer containing a resist material, preferably a polymeric resist material, that can contain a photoacid either by direct addition or by subsequent reaction and that can react with a silylating reagent, is deposited onto a substrate. The resist material is then exposed to a silylating reagent which penetrates into the resist material. The extent of the penetration will depend upon the silylation conditions, such as silylation time, the type of polymer resist material used, the temperature of the polymeric resist layer during exposure, and the type of silylating reagent used. Silylation can be accomplished either by reaction of the resist with the silylation reagent in the gas phase or in solution, either as a pure liquid or a solution of the silylating reagent in a suitable solvent, desirably a mixture of a nonsolvent and a solvent for the polymer resist material. Furthermore, the silylating reagent can be bifunctional or a combination of single and multifunctional silylation reagents. The crosslinking action of the multifunctional silylation reagents will provide a top layer with a higher glass transition temperature ($T_g$) and lead to improved imaging and decrease formation of volatile products.

A latent image, defined by the sum of exposed and unexposed areas on the imaging layer, is then transferred onto the imaging layer by exposing certain portions of the polymer resist material to radiation. Exposure can take place either by direct imaging through a mask or by radiation being reflected from a mask or reticle. Radiation incident upon the silylated resist material results in acid generation which catalyzes cleavage of Si—O bonds to produce moieties that are volatile enough to be driven off in a post exposure bake step, thereby desilylating the exposed areas of the resist material.

Another embodiment is contemplated wherein nonvolatile silicon-containing fragments are generated by acid catalyzed cleavage of the resist polymer backbone. This cleavage reaction generates base-soluble groups thereby rendering the resist polymer itself base-soluble. The silicon containing moieties cleaved from the resist polymer can be removed by solution development employing a basic solution, for example TMAH or the like. Following the post exposure bake step, an etching step, generally an oxygen plasma etch, removes all the resist material from the de-silylated areas of the resist material and converts the top 50 Å of the remaining silylated resist material to silicon dioxide.

BRIEF DESCRIPTION OF THE DRAWINGS

FIGS. 1 to 6 are a cross-sectional views of a process for resist patterning in accordance with the present invention.

DETAILED DESCRIPTION OF THE INVENTION

The novel process disclosed here for patterning resist material utilizes surface imaging techniques to produce an integrated circuit pattern with submicron features. In contrast to prior art bilayer silylation schemes, the process disclosed herein first creates a thin imaging layer with uniform silicon distribution in a bilayer format in one step. Pattern development then incorporates a de-silylation step, following exposure, that is self-limiting due the limited quantity of silyl groups within each region of the pattern. Moreover, because this process produces a thin imaging layer with uniform silicon distribution in a bilayer-like format it is particularly desirable for use with strongly attenuated radiation (e.g., light with a wavelength below ≈248 nm) since the complication of imaging through 1500–2000 Å of resist material is avoided as well as the problems associated with spin coating such thin films. Furthermore, the disclosed process permits both positive and negative tone patterning.

The method of the present invention will be described with reference to FIGS. 1 to 6. In FIG. 1 a substrate 110 is coated with a resist material 120 that can be a polymer resist material and can contain a photoacid generator or a photoacid precursor that can generate a photoacid by exposure to an external stimulus such as light. A preferred polymer resist material has the generic structural formula

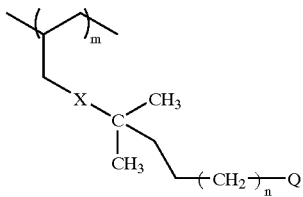

wherein X is pendant to the resist polymer and comprises an acid group such as a carboxylic acid, sulphonic acid or phenol either individually or incorporated into structures such as polycyclic hydrocarbons and aromatic hydrocarbons, and Q is a group such as OH or NH that can react selectively with an organosilicon compound. One example of a polymer resist material having the desired structure is polyvinylphenol. Other resist polymers, known to those skilled in the art can also be used, such as the general class of phenol-formaldehyde polymers commonly known as novolacs. The subscript "m" designates the number of structural units in the polymer backbone and is greater than 1. The subscript "n" is greater than 1.

A photoacid generator (PAG) is a compound that upon exposure to radiation releases hydrogen ions. Examples of suitable photoacid generators include, but are not limited to, 2,6-dinitrobenzyl tosylate, brominated aromatic compounds, onium salts, iodonium salts and non-ionic sulfonate salts. Although not shown here, it is contemplated that substrate 110 will have received prior processing that will have created surface variations or added parts of semiconductor devices to the top surface of substrate 110. Thus, polymer resist material 120 can include a planarizing layer.

The second step (FIG. 2) in the method of the present invention is to first softbake the polymer resist material to remove a portion or all of the residual solvent from the resist film; the softbake conditions being dependent upon the resist material and solvent used. For a polyvinylphenol resist material it is preferred that softbaking take place at a temperature of about 130° C. for about 120 seconds. Following the softbaking step the entire surface of resist polymer 120 is exposed to a silicon containing environment, thereby forming a layer of silylated resist material 125 in a single step operation. It is preferred that the silylating reagent be of the general form $SiR_1R_2R_3$, wherein $R_1$, $R_2$, and $R_3$ are the same or different and are selected from the group including H, $CH_3$, and $SiR'_1R'_2R'_3$, and groups $R'_1$ through $R'_3$ are selected from the group including H and $CH_3$ and can be the same or different. Paticularly preferred silylating reagents are dimethylaminodimethyldisilane (DMDS) or dimethylsilyldimethylamine (DMSDMA).

A suitable method for performing the silylation step is to expose polymer resist material 120 to an organosilane vapor in a conventional silylation tool for typically about 30–60 seconds at a temperature of up to about 90° C. Typically, aminosilanes such as dimethylaminodimethyldisilane (DMDS) or dimethylsilyldimethylamine (DMSDMA) can be used as a silylating reagent. Other silylating agents known to those skilled in the art can be used. By proper selection of the silylation parameters such as time, temperature, and composition of the silylating reagent it is possible to control the depth of silylated layer 125, a condition which is particularly desirable when strongly attenuated radiation such as extreme ultraviolet (EUV) radiation is used for patterning. While gaseous silylating reagents are preferred, liquid silylating agents can also be used. Those will appreciate it skilled in the art, that multifunctional silylation reagents, including bifunctional silylation reagents, are also useful in this capacity.

The next step, illustrated in FIG. 3, is to pattern silylated resist material 125. In the illustrated example, patterning takes place with the aid of mask 130 interposed between an energy source, such as a light source, and silylated resist material 125. Energy 135 (typically light energy) passes through the openings in mask 130 and onto silylated resist material 125. The silylated resist material can also be exposed by means of a reflective mask (not shown), wherein energy/radiation is projected onto the surface of silylated resist material 125 from the reflective mask or reticle.

FIG. 4 illustrates the step of forming the desired pattern in silylated resist material 125. In those areas of silylated resist material 125 which are exposed to energy 135, typified by area 140, the acid catalyzed cleavage of Si—O bonds takes place releasing, it is believed, volatile silanol and siloxane monomers.

By changing the character of the silylating reagent, from monofunctional to bifunctional or multifunctional, it is possible to effect the volatility of the silanol and siloxane monomer reaction products. It is expected that the use of a silylating reagent having monosilane groups such as trimethylsilyl would produce more volatile acid catalyzed reaction products. On the other hand, care must be exercised in choosing the silylating reagent in order to ensure that the glass transition temperature ($T_g$) of the resist material is not lowered to such a degree as to cause pattern distortion in subsequent heat treatment steps Following the step of patterning and acid catalyzed cleavage of the silylated resist material (FIG. 4), the entire structure is subjected to a post exposure vacuum bake, FIG. 5, which removes the volatile silicon monomer reaction products from the exposed areas 140 of the resist material. It is preferred that the post exposure bake take place at a temperature of about 120° C. which is generally sufficient to remove the silicon monomer reaction products. The surface of resist material 120 is now composed of regions of silylated resist material 125 and regions 140 from which the silicon has been removed leaving behind unsilylated resist material.

The next step, illustrated by FIG. 6, is to etch the resist material by a conventional etching processes, such as an oxygen plasma etch which simultaneously converts the top portion of the silicon enriched layer 125 to silicon dioxide and removes the remaining portions of layer 140, thus exposing the surface of substrate 110 for further processing The foregoing is exemplified by the following generalized reaction scheme

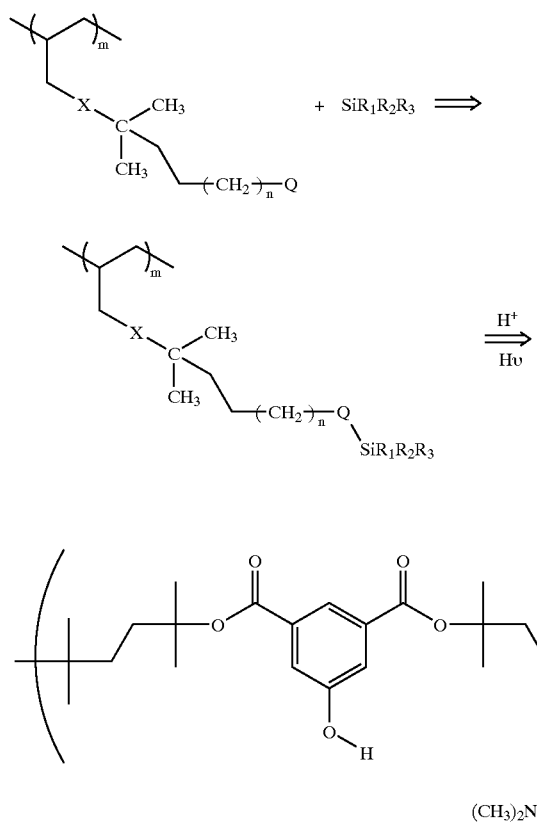

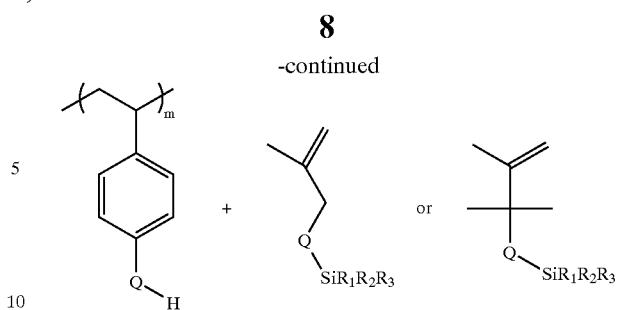

wherein $R_1$, $R_2$, and $R_3$ can be the same or different and can be selected from the group including H, $CH_3$, and $SiR'_1R'_2R'_3$. Groups $R'_1$ through $R'_3$ can be selected from the group including H and $CH_3$ and can be the same or different. The reaction products can be either volatile or base-soluble. By selecting $R_1$, $R_2$, or $R_3$ as $SiR'_1R'_2R'_3$ multifunctional (i.e., di or tri-silyl) silylating reagents are possible.

In another embodiment of the disclosed process, the post exposure bake step (FIG. 5) with concurrent volatilization of silicon monomer reaction products is replaced by a solution development step employing a suitable basic solvent such as tetramethylammonium hydroxide (TMAH). In this embodiment, a non-volatile silicon-containing fragment is generated by acid catalyzed cleavage of the resist polymer backbone rather than the side chains. It is preferred that a photoacid generator (PAG), a material that upon exposure to radiation releases hydrogen ions, be the source of the acid. By cleaving the backbone of the resist polymer into smaller fragments solubility is increased. Additionally, polar functionalities are generated on the resist polymer fragments that also improve solubility. Thus, the post exposure bake step (FIG. 5) is replaced by solution development wherein the silicon-containing moiety cleaved from the resist polymer can be removed by solution development employing a basic solution, for example TMAH or the like. Following the post exposure bake step and solution development, an etching step, generally an oxygen plasma etch, removes all the resist material from the de-silylated areas of the resist material and converts the top 50 Å of the remaining silylated resist material to silicon dioxide.

This embodiment offers the advantage that the unexposed resist material is not soluble in an aqueous base solvent and thus, it is believed that there will be less tendency to undercut the remaining resist material during the etch step. Moreover, the solution development step is self-limiting, removing only regions exposed, the silylation byproduct and the base-soluble resist polymer. Further, this embodiment provides for processing in environments where volatile materials are not tolerated well.

The following generalized reaction scheme exemplifies this embodiment

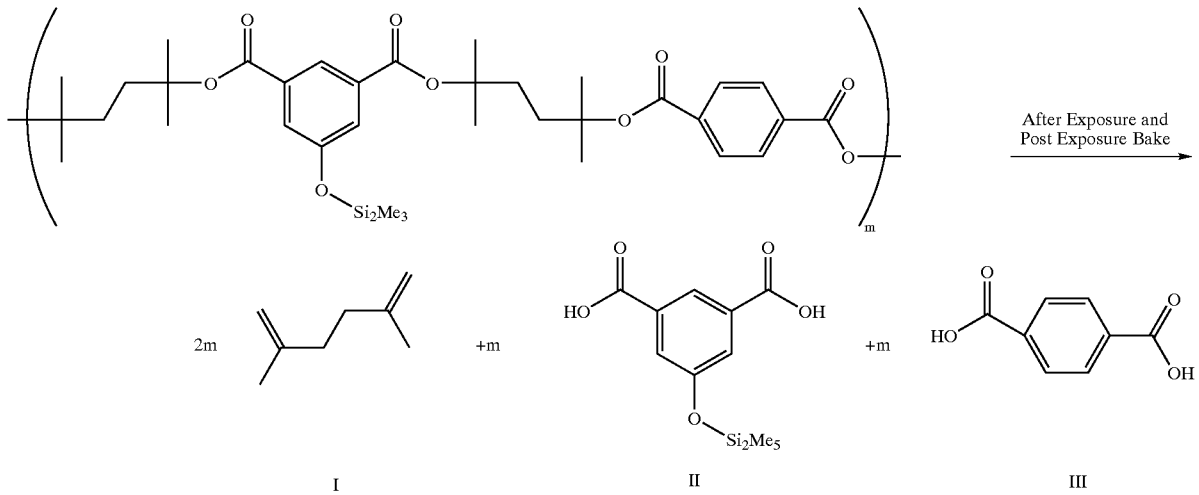

wherein the silylating reagent is represented by $SiR_1R_2R_3$, and $R_1$, $R_2$, and $R_3$ can be the same or different and can be selected from the group including H, $CH_3$, $(CH_3)_2N$ and $SiR'_1R'_2R'_3$. Groups $R'_1$ through $R'_3$ can selected from the group including H and $CH_3$ and can be the same or different. The reaction products can be either volatile or base-soluble. By selecting $R_1$, $R_2$, or $R_3$ as $SiR'_1R'_2R'_3$ multifunctional (i.e., di or tri-silyl) silylating reagents are possible. A particularly preferred silylating reagents are dimethylaminodimethyldisilane, dimethylsilyldimethylamine, and pentamethyldisilyldimethylamine. Some or all the fragments I, II, and III are base-soluble so that base solution development can be employed.

From the foregoing description, one skilled in the art can readily ascertain the essential characteristics of the present invention. The description is intended to be illustrative of the present invention and not to be construed as a limitation or restriction thereon, the invention being delineated in the following claims.

What is claimed is:

1. A method for forming a circuit pattern on a substrate, comprising the steps of:
    a) depositing a layer of a polymer resist material onto a substrate, wherein the polymer resist material comprises a compound having the structural formula wherein X is an acid group including carboxylic acid or sulphonic acid, and Q is a group that reacts selectively with an organosilicon compound and m and n are greater than 1;
    b) soft baking the polymer resist material;
    c) exposing the polymer resist material to a silylating reagent to form a silicon containing compound in a single step;
    d) exposing the silylated polymer resist material to radiation having a wavelength below 248 nm to form an exposed region and an unexposed region on the silylated polymer resist material that together form a circuit pattern;
    e) removing the exposed regions of the silylated polymer resist material by baking the exposed silylated resist material in a vacuum; and
    f) etching the resulting polymer resist material with an oxygen plasma to remove the unsilylated resist material and to convert the remaining silylated resist material to silicon dioxide.

2. The method claim 1, wherein the polymer resist material further includes a photoacid generator compound.

3. The method of claim 2, wherein the photoacid compound is selected from the group consisting of 2,6-dinitrobenzyl tosylate, brominated aromatic compounds, onium salts, iodonium salts and non-ionic sulfonate salts.

4. The method of claim 1, wherein Q is OH or NH.

5. The method of claim 1, wherein the step of depositing further includes depositing a planarizing layer between the substrate and the resist material.

6. The method of claim 1, wherein the silylating reagent comprises a liquid or gaseous organosilicon compound.

7. The method of claim 6, wherein the silylating reagent is selected from the class of compounds having the formula $SiR_1R_2R_3$, wherein $R_1$, $R_2$, and $R_3$ are the same or different and include H, $CH_3$, and $SiR'_1R'_2R'_3$, and groups $R'_1$ through $R'_3$ include H and $CH_3$ and can be the same or different.

8. The method of claim 7, wherein the silylating reagent is dimethylaminodimethyldisilane or dimethylsilyldimethylamine.

9. The method of claim 1, wherein baking takes place at a temperature of less than about 120° C.

10. The method of claim 1, wherein the silylating reagent is monofunctional, multifunctional, or a combination thereof.

11. A method for forming a circuit pattern on a substrate, comprising:
    a) depositing a layer of a polymer resist material onto a substrate, wherein the polymer resist material comprises a photoacid generator compound and a compound having the structural formula

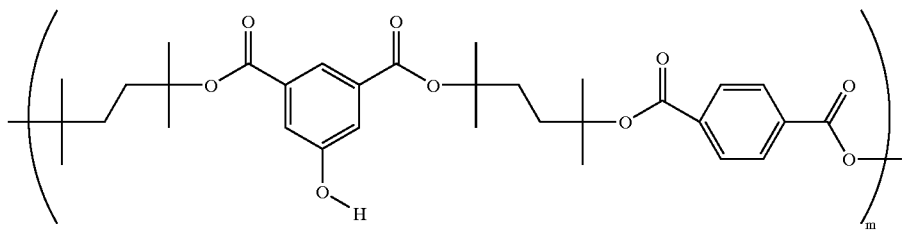

wherein m is greater than 1;
b) soft baking the polymer resist material;
c) exposing the polymer resist material to a silylating reagent to form a silicon containing compound in a single step;
d) exposing the silylated polymer resist material to radiation having a wavelength below 248 nm to form an exposed region and an unexposed region on the silylated polymer resist material;
e) removing the exposed regions of the silylated polymer resist material by dissolving the exposed silylated polymer resist material in a basic solution; and
f) etching the resulting polymer resist material with an oxygen plasma.

12. The method of claim 11, wherein the silylating reagent is selected from the class of compounds having the formula $SiR_1R_2R_3$, wherein $R_1$, $R_2$, and $R_3$ are the same or different and include H, $CH_3$, $(CH_3)_2N$, and $SiR'_1R'_2R'_3$, and groups $R'_1$ through $R'_3$ include H and $CH_3$ and can be the same or different.

13. The method of claim 11, wherein the silylating reagent is monofunctional, multifunctional, or a combination thereof.

14. The method of claim 11, wherein the silylating reagent is dimethylaminodimethyldisilane, dimethylsilyldimethylamine, or pentamethyldisilyldimethylamine.

* * * * *